United States Patent
Li et al.

(10) Patent No.: US 6,770,418 B2
(45) Date of Patent: Aug. 3, 2004

(54) POSITIVE RESIST COMPOSITIONS CONTAINING NON-POLYMERIC SILICON

(75) Inventors: Wenjie Li, Poughkeepsie, NY (US); Pushkara Rao Varanasi, Poughkeepsie, NY (US); Ranee Kwong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 201 days.

(21) Appl. No.: 10/026,120

(22) Filed: Dec. 21, 2001

(65) Prior Publication Data

US 2003/0124453 A1 Jul. 3, 2003

(51) Int. Cl.$^7$ ............ G03C 1/73; G03F 7/039; G03F 7/30; G03F 7/20; G03F 7/36
(52) U.S. Cl. .......... 430/270.1; 430/905; 430/907; 430/910; 430/313; 430/326; 430/323; 430/330; 430/331; 430/316; 430/317; 430/318
(58) Field of Search ............ 430/270.1, 905, 430/907, 910, 313, 326, 323, 327, 330, 331, 316, 317, 318

(56) References Cited

U.S. PATENT DOCUMENTS

| | | | | |
|---|---|---|---|---|
| 5,304,453 A | * | 4/1994 | Lin | 430/252 |
| 5,693,452 A | * | 12/1997 | Aoai et al. | 430/270.1 |
| 2002/0061465 A1 | * | 5/2002 | Hasegawa et al. | 430/270.1 |

* cited by examiner

*Primary Examiner*—Mark F. Huff
*Assistant Examiner*—Sin J. Lee
(74) *Attorney, Agent, or Firm*—Steven Capella

(57) ABSTRACT

Acid-catalyzed positive resist compositions suitable for bilayer or multilayer lithographic applications are enabled by the use of a combination of (a) an acid-sensitive imaging polymer, (b) a radiation-sensitive acid generator, and (c) a non-polymeric silicon additive. The imaging polymer is preferably imageable with 193 nm or shorter wavelength imaging radiation. The resist compositions preferably contain at least about 5 wt. % silicon based on the weight of the imaging polymer. The compositions generally provide reduced line edge roughness compared to conventional silicon-containing resists.

17 Claims, No Drawings

POSITIVE RESIST COMPOSITIONS CONTAINING NON-POLYMERIC SILICON

BACKGROUND OF THE INVENTION

In the microelectronics industry as well as in other industries involving construction of microscopic structures (e.g. micromachines, magnetoresistive heads, etc.), there is a continued desire to reduce the size of structural features. In the microelectronics industry, the desire is to reduce the size of microelectronic devices and/or to provide greater amount of circuitry for a given chip size.

Effective lithographic techniques are essential to achieving reduction of feature sizes. Lithography impacts the manufacture of microscopic structures not only in terms of directly imaging patterns on the desired substrate, but also in terms of making masks typically used in such imaging. Typical lithographic processes involve formation of a patterned resist layer by patternwise exposing the radiation-sensitive resist to an imaging radiation. The image is subsequently developed by contacting the exposed resist layer with a material (typically an aqueous alkaline developer) to selectively remove portions of the resist layer to reveal the desired pattern. The pattern is subsequently transferred to an underlying material by etching the material in openings of the patterned resist layer. After the transfer is complete, the remaining resist layer is then removed.

The resolution capability of lithographic processes is generally a function of the wavelength of imaging radiation, the quality of the optics in the exposure tool and the thickness of the imaging layer. As the thickness of the imaging resist layer increases, the resolution capability decreases. Thinning of a conventional single layer resist to improve resolution generally results in compromise of the etch resistance of the resist which is needed to transfer the desired image to the underlying material layer. In order to obtain the resolution enhancement benefit of thinner imaging layers, multilayer lithographic processes (e.g., so-called bilayer process) have been developed. In multilayer lithographic processes, a so-called planarizing underlayer is used intermediate between the imaging resist layer (typically a silicon-containing resist) and the underlying material layer to be patterned by transfer from the patterned resist. The underlayer receives the pattern from the patterned resist layer, and then the patterned underlayer acts as a mask for the etching processes needed to transfer the pattern to the underlying material.

The imaging layer of a bilayer or multilayer resist process typically uses a silicon-containing acid-sensitive polymer. The silicon content acts to provide differential etch characteristics relative to the planarizing underlayer (which is typically free of silicon). Typically, the silicon-containing resist polymer contains at least about 5 or 6 wt. % silicon.

In addition to having significant silicon content, the imaging layer resist composition must also possess the desired lithographic performance with the imaging radiation of interest. With the continued move toward higher resolution lithography, the imaging radiation of interest is quickly becoming 193 nm wavelength (ArF) ultraviolet radiation and is expected to become 157 nm ($F_2$) ultraviolet radiation. Thus, the respective silicon-containing resists for use at these wavelengths must possess desirable optical characteristics and dissolution behavior (i.e., selective dissolution of exposed areas) to enable image resolution at a desired radiation wavelength. Given the extensive experience in the lithographic arts with the use of aqueous alkaline developers, it is important highly desirable to achieve appropriate dissolution behavior in such commonly used developer solutions. A key indicator of the quality of overall imaging performance is so-called line-edge roughness (LER). Thus, it is desirable to obtain silicon-containing resist formulations which provide patterned resist structures exhibiting reduced line-edge roughness.

The general approach in developing resist for bilayer applications has largely been to place the required silicon content on the acid-sensitive imaging polymer. This approach often leads to the need to totally redesign the resist polymer and/or to incorporation of so much silicon-containing moiety on the polymer that the lithographic performance of the resist becomes less than desired. Thus, there is a desire for silicon-containing resist formulations that do not require as much silicon-content on the polymer component of the resist.

SUMMARY OF THE INVENTION

The invention provides silicon-containing resist compositions which are capable of high resolution lithographic performance, especially in bilayer or multilayer lithographic applications using 193 nm or shorter wavelength imaging radiation. The resist compositions of the invention are generally characterized by the presence of (a) an acid-sensitive imaging polymer, (b) a radiation-sensitive acid generator, and (c) a non-polymeric silicon additive.

In one aspect, the invention encompasses a silicon-containing resist composition comprising:
(a) an acid-sensitive imaging polymer,
(b) a radiation-sensitive acid generator, and
(c) a non-polymeric silicon additive.

The imaging polymer is preferably useful in 193 nm lithographic processes and preferably contains a monomer selected from the group consisting of a cyclic olefin, an acrylate and a methacrylate. The resist composition preferably contains at least about 5 wt. % silicon based on weight of the imaging polymer. The non-polymeric silicon additive contains at least about 10 carbon atoms, more preferably at least about 12 to 30 carbon atoms. The non-polymeric silicon additive preferably has a molecular weight of about 250 to 1000.

In another aspect, the invention encompasses a method of forming a patterned material structure on a substrate, the material being selected from the group consisting of semiconductors, ceramics and metals, the method comprising:
(A) providing a substrate with a layer of the material,
(B) forming a planarizing layer over the material layer,
(C) applying a resist composition over the planarizing layer to form a resist layer, the resist composition comprising:
(a) an acid-sensitive imaging polymer,
(b) a radiation-sensitive acid generator, and
(c) a non-polymeric silicon additive.
(D) patternwise exposing the substrate to radiation whereby acid is generated by the radiation-sensitive acid generator in exposed regions of the resist layer by the radiation,
(E) contacting the substrate with an aqueous alkaline developer solution, whereby the exposed regions of the resist layer are selectively dissolved by the developer solution to reveal a patterned resist structure,
(F) transferring resist structure pattern to the planarizing layer, by etching into the planarizing layer through spaces in the resist structure pattern, and (G) transferring the structure pattern to the material layer, by etching into the material layer through spaces in the planarizing layer pattern.

The etching of step (G) is preferably reactive ion etching. The imaging radiation preferably has a wavelength of about 193 nm. The substrate is preferably baked between steps (D) and (E).

These and other aspects of the invention are discussed in further detail below.

DETAILED DESCRIPTION OF THE INVENTION

The resist compositions of the invention are generally characterized by the presence of (a) an acid-sensitive imaging polymer, (b) a radiation-sensitive acid generator, and (c) a non-polymeric silicon additive. These compositions are especially capable of providing high resolution lithographic patterns in bilayer or multilayer lithographic processes. The invention further encompasses processes for creating and using patterned resist structures based on the resist compositions of the invention to form conductive, semiconductive and/or insulative structures.

The resist compositions of the invention preferably comprise:

(a) an acid-sensitive imaging polymer, (b) a radiation-sensitive acid generator, and (c) a non-polymeric silicon additive.

The resist compositions of the invention are not limited to the use of any specific imaging polymer. Preferably, the imaging polymer is an acid-sensitive polymer having acid-labile pendant groups which can be cleaved in the presence of acid generated upon exposure (and/or post-exposure bake) of the resist composition to the desired imaging radiation. The cleaving of the acid labile groups acting to create enhanced solubility (in a developer solution—typically an aqueous alkaline solution) in the exposed regions of the resist.

The imaging polymer may itself contain significant amounts of silicon such as would normally be contained in a silicon-containing polymer for use in bilayer resist lithography. Examples of silicon-containing imaging polymers are disclosed in U.S. Pat. Nos. 5,985,524; 6,146,793; and 6,165,682, the disclosures of which are incorporated herein by reference. Other examples of suitable polymers are disclosed in U.S. patent application Ser. No. 09/514,212, filed Feb. 28, 2000, the disclosure of which is incorporated herein by reference.

Alternatively, the imaging polymer may have little or no silicon content. In such instances, the non-polymeric silicon additives of the invention enable the use of conventional single-layer resist polymers in bilayer applications. For 193 nm lithographic processes, the imaging polymer preferably contains a monomer selected from the group consisting of a cyclic olefin, an acrylate and a methacrylate. For example, the imaging polymer may be an acrylate polymer such as described in U.S. Pat. Nos. 5,580,694 and 6,156,678, the disclosures of which are incorporated herein by reference. More preferably, the imaging polymer contains at least some cyclic olefin monomer. Examples of polymers containing cyclic olefin monomers may be of the so-called alternating copolymer variety such as disclosed in U.S. Pat. Nos. 5,843,624; 6,048,664 and 6,132,926, the disclosures of these documents is incorporated herein by reference. Most preferably, the imaging polymer is a non-alternating (as opposed to alternating copolymers where polymerization preferentially occurs in alternation sequence of monomers) copolymer containing cyclic olefin monomers. Examples of such non-alternating copolymers are described in U.S. Pat. Nos. 6,124,074 and 6,251,560, the disclosures of which is incorporated herein by reference.

The imaging polymer is preferably further characterized by the presence of acid-labile pendant moieties on at least a portion of the monomers making up the imaging polymer. The acid-labile moieties preferably act to inhibit solubility of the resist composition in aqueous alkaline solutions. Preferred acid-labile protecting moieties are selected from the group consisting of tertiary alkyl (or cycloalkyl) esters (e.g., t-butyl, methyl cyclopentyl, methyl cyclohexyl, methyl adamantyl), ketals, and acetals. Tertiary butyl ester and methyl cyclopentyl ester are most preferred acid-labile protecting moieties. If desired, combinations of monomers having differing protecting functional groups may be used. The acid-labile pendant moieties are preferably present in sufficient amount to maintain the imaging polymer substantially insoluble in aqueous alkaline developers in the prior to exposure to any imaging radiation. Upon exposure to imaging radiation, at least a portion of the acid labile moieties in the exposed portions of the resist would be cleaved causing a shift in the aqueous alkaline solubility of the exposed portions of the resist.

The imaging polymer is preferably further characterized by the presence of polar functional moieties which promote solubility in aqueous alkaline solutions. Preferred polar moieties are acidic polar moieties having a $pK_a \leq 13$. More preferably, the polar groups are selected from the group consisting of carboxyl, sulfonamidyl, fluoroalcohol, and other acidic polar groups, most preferably carboxyl groups. The polar moieties are preferably present in sufficient amounts to enable the radiation-exposed resist to be aqueous alkaline soluble.

Where the resist is to be used in a 157 nm lithographic process, the imaging polymer preferably contains fluorine moieties and/or silicon moieties.

The resist compositions of the invention are further characterized by the presence of a non-polymeric silicon additive. The non-polymeric silicon additive preferably contains a significant amount of silicon, e.g., a weight fraction of silicon of at least about 0.12, more preferably about 0.15–0.35. The non-polymeric silicon additive is preferably non-volatile, preferably having a boiling point and/or sublimation temperature of at least 150° C., more preferably at least 170° C. The non-polymeric silicon additive preferably has a molecular weight of about 3000 or less, more preferably less than about 1500, most preferably about 250 to 1000. The non-polymeric silicon additive preferably has one or more bulky constituents (e.g., ring structures) such as saturated alicyclic structures, however the non-polymeric silicon additive is preferably free of unsaturated carbon-carbon bonds. The non-polymeric silicon additive contains at least 10 carbon atoms, more preferably about 12–30 carbons.

If desired, the non-polymeric silicon additive may be free of functionality actively affecting the solubility of the overall resist composition. Alternatively, the non-polymeric silicon additive may contain (a) acid labile groups which inhibit the solubility of the unexposed portions of the resist, but cause an increase in solubility upon reaction with generated acid in exposed portions of the resist, and/or (b) polar groups (e.g., lactones) which promote the solubility of the resist.

Examples of possible non-polymeric silicon additives not having acid labile moieties are illustrated below: Tris (trimethylsilylmethyl) 1,3,5-cyclohexanetricarboxylate (TMSCT), Bis(trimethylsilylmethyl) 1,4- cyclohexanedicarboxylate (TMSCD), Bis(bis(trimethylsilyl)methyl) 1,4-cyclohexanedicarboxylate (BTSCD), Bis(tris(trimethylsiloxysilyl)methyl) 1,4-cyclohexanedicarboxylate (BSOSCD), Tris(trimethylsiloxysilyl)methyl 1-adamantanecarboxylate (SOSAC).

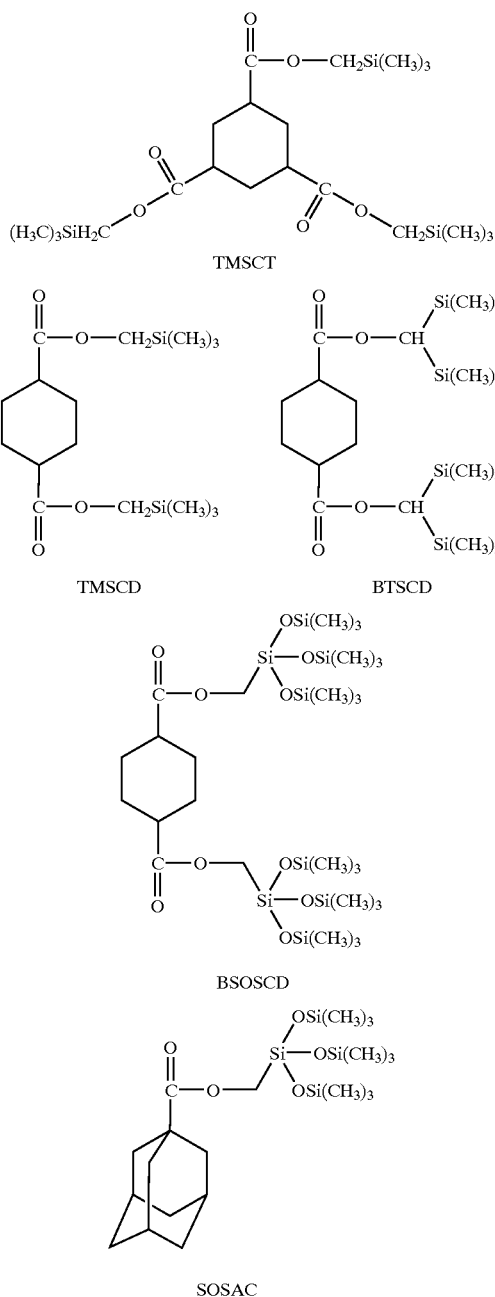

An example of non-polymeric silicon additive containing acid labile moieties is 2,5-Bis(trimethylsilylmethylcarboxyloxy)-2,5-dimethylhexane (BTSDMH) below. Also shown below are examples of lactone-containing non-polymeric silicon additives, 4-Bis(trimethylsilyl)methoxymethyl γ-butyrolactone (BTSMBL) and 4-Tris(trimethylsiloxy)silylmethoxymethyl γ-butyrolactone (SOSMBL), below:

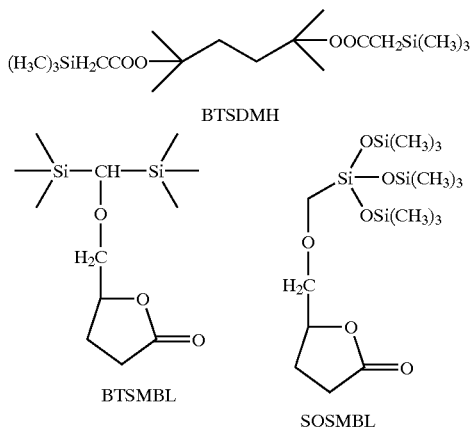

The resist compositions of the invention contain a radiation-sensitive acid generator. The invention is not limited to the use of any specific radiation-sensitive acid generator or combination of acid generators, that is the benefits of the invention may be achieved using various radiation-sensitive acid generators known in the art. Preferred acid generators are those which contain reduced amounts (or preferably no) aryl moieties. Where aryl-containing acid generator is employed, the absorptive characteristics of the acid generator at wavelengths below 248 nm (e.g., 193 nm or 157 nm) may restrict the amount of acid generator that can be included in the formulation.

Examples of suitable radiation-sensitive acid generators include (but preferably with alkyl substituted for one or more of any indicated aryl moieties) onium salts such as triaryl sulfonium or diaryliodonium hexafluoroantimonate, hexafluoroarsenates, triflates, perfluoroalkane sulfonates (e.g., perfluoromethane sulfonate, perfluorobutane, perfluorohexane sulfonate, perfluorooctane sulfonate, etc.), perfluoroalkyl sulfonyl imide, perfluoroalkyl sulfonyl methide, perfluoroaryl sulfonyl imide, perfluoroaryl sulfonyl methide; substituted aryl sulfonates such as pyrogallols (e.g. trimesylate of pyrogallol or tris(sulfonate) of pyrogallol), sulfonate esters of hydroxyimides, N-sulfonyloxynaphthalimides (N-camphorsulfonyloxynaphthalimide, N-pentafluorobenzenesulfonyloxynaphthalimide), α-α'bis-sulfonyl diazomethanes, naphthoquinone-4-diazides, alkyl disulfones and others.

The resist compositions of the invention will typically contain a solvent prior to their application to the desired substrate. The solvent may be any solvent conventionally used with acid-catalyzed resists which otherwise does not have any excessively adverse impact on the performance of the resist composition. Preferred solvents are propylene glycol monomethyl ether acetate and cyclohexanone.

The compositions of the invention may further contain minor amounts of auxiliary components such as dyes/sensitizers, base additives, etc. as are known in the art. Preferred base additives are weak bases which scavenge trace acids while not having an excessive impact on the performance of the resist. Preferred base additives are (aliphatic or alicyclic) tertiary alkyl amines or t-alkyl ammonium hydroxides such as t-butyl ammonium hydroxide (TBAH). If necessary, the compositions of the invention can be adjusted to respond to the desired imaging radiation by the addition of an appropriate dye or sensitizer to the composition. Preferably, the compositions of the invention are suitable for use with 193 nm and/or 157 nm imaging radiation.

The resist compositions of the invention preferably contain about 0.5–20 wt. % (more preferably about 1–15 wt. %) radiation-sensitive acid generator based on the total weight of imaging polymer in the composition. Where a solvent is present, the overall composition preferably contains about 50–95 wt. % solvent. The composition preferably contains about 1 wt. % or less of the base additive based on the total weight of acid sensitive polymer. The resist compositions of the invention preferably contain at least about 5 wt. % of non-polymeric silicon additive based on the total weight of imaging polymer in the composition, more preferably about 10–30 wt. %, most preferably about 10–20 wt. %. Preferably, the combination of the imaging polymer and the non-polymeric silicon additive are selected to achieve a silicon content of at least about 5 wt. % based on the weight of the imaging polymer, more preferably about 6–10 wt. %.

The resist compositions of the invention can be prepared by combining the imaging polymer, radiation-sensitive acid generator, non-polymeric silicon additive and any other desired ingredients using conventional methods. The resist composition to be used in lithographic processes will generally have a significant amount of solvent.

The resist compositions of the invention are especially useful for lithographic processes used in the manufacture of integrated circuits on semiconductor substrates. The compositions are especially useful for bilayer or multilayer lithographic processes.

Semiconductor lithographic applications generally involve transfer of a pattern to a layer of material on the semiconductor substrate. The material layer of the semiconductor substrate may be a metal conductor layer, a ceramic insulator layer, a semiconductor layer or other material depending on the stage of the manufacture process and the desired material set for the end product. The composition of the invention is preferably applied directly over a planarizing underlayer material which has been directly applied over the material layer to be patterned.

Typically, the solvent-containing resist composition is applied using spin coating or other technique. The substrate with the resist coating is then preferably heated (pre-exposure baked) to remove the solvent and improve the coherence of the resist layer. The thickness of the applied layer is preferably as thin as possible provided that the thickness is preferably substantially uniform and that the resist layer be sufficient to withstand subsequent processing (typically reactive ion etching) to transfer the lithographic pattern to the planarizing underlayer. The pre-exposure bake step is preferably conducted for about 10 seconds to 15 minutes, more preferably about 15 seconds to one minute. The pre-exposure bake temperature may vary depending on the glass transition temperature of the resist.

After solvent removal, the resist layer is then patternwise-exposed to the desired radiation (e.g., 193 nm ultraviolet radiation). Where scanning particle beams such as electron beam are used, patternwise exposure may be achieved by scanning the beam across the substrate and selectively applying the beam in the desired pattern. More typically, where wavelike radiation forms such as 193 nm ultraviolet radiation, the patternwise exposure is conducted through a mask which is placed over the resist layer. For 193 nm UV radiation, the total exposure energy is preferably about 100 millijoules/cm$^2$ or less, more preferably about 50 millijoules/cm$^2$ or less (e.g. 15–30 millijoules/cm$^2$).

After the desired patternwise exposure, the resist layer is typically baked to further complete the acid-catalyzed reaction and to enhance the contrast of the exposed pattern. The post-exposure bake is preferably conducted at about 60–175° C., more preferably about 90–160° C. The post-exposure bake is preferably conducted for about 30 seconds to 5 minutes.

After post-exposure bake, the resist structure with the desired pattern is obtained (developed) by contacting the resist layer with an alkaline solution which selectively dissolves the areas of the resist which were exposed to radiation. Preferred alkaline solutions (developers) are aqueous solutions of tetramethyl ammonium hydroxide. The resulting lithographic structure on the substrate is then typically dried to remove any remaining developer solvent.

The pattern from the resist structure may then be transferred to the exposed portions of the planarizing underlayer of the invention by reactive ion etching or other suitable etch techniques known in the art.

After the opening of the planarizing underlayer of the invention, the underlying material layer to be patterned may then be etched using an etchant appropriate to the material layer composition. Once the desired pattern transfer has taken place, any remaining underlayer and resist may be removed using conventional stripping techniques.

Examples of lithographic processes where the composition of the invention may be useful as are disclosed in U.S. Pat. Nos. 4,855,017; 5,362,663; 5,429,710; 5,562,801; 5,618,751; 5,744,376; 5,801,094; and 5,821,469, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988), the disclosure of which is incorporated herein by reference. It should be understood that the invention is not limited to any specific lithographic technique or device structure.

EXAMPLE 1

Synthesis of TMSCT 17.2 g (0.144 mol) of thionyl chloride was added slowly to 3.1 g (0.0143 mol) of 1,3,5-haxanetricarboxylic acid in a dry flask. The mixture was heated to reflux for 2 hours. After the reaction was completed, the unreacted thionyl chloride was removed by distillation. ~10 ml of anhydrous toluene was added. The solution was stirred at room temperature for 20 minutes. The solvent was then removed by distillation. The resulting 1,3,5-hexanetricarboxylic acid chloride was dried under vacuum for 2 hours.

To a solution containing 3.0 g (0.011 mol) of the above 1,3,5-hexanetricarboxylic acid chloride and 3.44 g (0.033 mol) of (trimethylsilyl)methanol in 35 ml of anhydrous methylene chloride, 3.34 g (0.033 mol) of triethylamine was added slowly at room temperature. The resulting solution was refluxed overnight. The reaction mixture was filtered through celite. The filtrate was concentrated by Rotavap. The product was redissolved in ~100 ml of diethyl ether, washed with water (×75 ml) three times, dried over anhydrous magnesium sulfate, and then concentrated under reduced pressure. The product was further dried under vacuum at 50° C. overnight to give 5.2 g (>95%) of viscous liquid which was identified as Tris(trimethylsilylmethyl) 1,3,5-cyclohexanetricarboxylate (TMSCT) by NMR spectroscopy.

EXAMPLE 2

Lithographic Evaluation

Resist formulations were prepared in the examples below by mixing the desired polymer(s) (e.g., norbornene-maleic anhydride copolymer in which two different norbornene monomers with different silicon substituents (acid-labile and non-acid-labile) are incorporated) with 0.12 to 0.3 wt. % tetrabutyl ammonium hydroxide (TBAH) and 5 to 10 wt. % of photoacid generator(s) in PGMEA solvent. The total solids content in the resulting formulation was about 10 wt. %.

A resist formulation according to the invention containing a blend of Si-containing polymer and Si-containing additive (TMSCT) at a 90/10 wt. ratio was prepared using the standard resist formulation above. The resist formulation was spin-coated onto ARC coated wafers and baked on a hot plate at 130° C. for 1 minute. The film was then imagewise exposed at 193 nm followed by a post exposure bake at 130° C. for 1 minute. The film was then developed with 0.263N tetramethylammonium hydroxide. Compared to resist formulation without the Si-containing additive, this formulation has better image line edge roughness (LER) and resolution.

What is claimed is:

1. A silicon-containing resist composition, said composition comprising
    (a) an acid-sensitive, silicon-containing imaging polymer,
    (b) a radiation-sensitive acid generator, and
    (c) a non-polymeric silicon additive which is free of acid labile moieties and/or which contains lactone.

2. The resist composition of claim 1 wherein said imaging polymer contains a monomer selected from the group consisting of a cyclic olefin, an acrylate and a methacrylate.

3. The resist composition of claim 1 wherein said imaging polymer contains fluorine moieties.

4. The resist composition of claim 1 wherein said composition contains at least about 5 wt. % silicon based on weight of said imaging polymer.

5. The resist composition of claim 1 wherein said non-polymeric silicon additive contains at least about 10 carbon atoms.

6. The resist composition of claim 1 wherein said non-polymeric silicon additive contains at least two silicon-containing moieties.

7. The resist composition of claim 1 wherein said non-polymeric silicon additive contains at least one ring structure.

8. The resist composition of claim 1 wherein said non-polymeric silicon additive has a weight average molecular weight of less than 3000 and a sublimation temperature or boiling point of at least 150° C.

9. A method of forming a patterned material structure on a substrate, said material being selected from the group consisting of semiconductors, ceramics and metals, said method comprising:
    (A) providing a substrate with a layer of said material,
    (B) forming a planarizing layer over said material layer,
    (C) applying a resist composition over said planarizing layer to form a resist layer, said resist composition comprising:
        (a) an acid-sensitive imaging polymer,
        (b) a radiation-sensitive acid generator, and
        (c) a non-polymeric silicon additive which is free of acid labile moieties and/or which contains lactone,
    (D) patternwise exposing said substrate to radiation whereby acid as generated by said radiation-sensitive acid generator in exposed regions of said resist layer by said radiation,
    (E) contacting said substrate with an aqueous alkaline developer solution, whereby said exposed regions of said resist layer are selectively dissolved by said developer solution to reveal a patterned resist structure,
    (F) transferring resist structure pattern to said planarizing layer, by etching into said planarizing layer through spaces in said resist structure pattern, and
    (G) transferring said structure pattern to said material layer, by etching into said material layer through spaces in said planarizing layer pattern.

10. The method of claim 9 wherein said etching of step (G) comprises reactive ion etching.

11. The method of claim 9 wherein said radiation has a wavelength of about 193 nm.

12. The method of claim 9 wherein said substrate is baked between steps (D) and (E).

13. The method of claim 9 wherein said imaging polymer contains a monomer selected from the group consisting of a cyclic olefin, an acrylate and a methacrylate.

14. The method of claim 9 wherein said imaging polymer contains fluorine moieties.

15. The method of claim 9 wherein said composition contains at least about 5 wt. % silicon based on weight of said imaging polymer.

16. The method of claim 9 wherein said non-polymeric silicon additive contains at least about 10 carbon atoms.

17. The method of claim 16 wherein said imaging polymer contains silicon.

* * * * *